United States Patent
Zhang et al.

(10) Patent No.: US 9,432,055 B2
(45) Date of Patent: Aug. 30, 2016

(54) ENCODER FOR QUASI-CYCLIC LOW-DENSITY PARITY-CHECK CODES OVER SUBFIELDS USING FOURIER TRANSFORM

(71) Applicant: SANDISK ENTERPRISE IP LLC, Dallas, TX (US)

(72) Inventors: Xinmiao Zhang, Seattle, WA (US); Ying Yu Tai, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/316,128

(22) Filed: Jun. 26, 2014

(65) Prior Publication Data

US 2015/0381205 A1 Dec. 31, 2015

(51) Int. Cl.
| | | |
|---|---|---|
| G11C 29/00 | (2006.01) | |
| H03M 13/11 | (2006.01) | |
| H03M 13/00 | (2006.01) | |
| G06F 17/14 | (2006.01) | |

(52) U.S. Cl.
CPC ....... *H03M 13/116* (2013.01); *H03M 13/1171* (2013.01); *H03M 13/616* (2013.01); *H03M 13/6502* (2013.01); *G06F 17/14* (2013.01)

(58) Field of Classification Search
None
See application file for complete search history.

(56) References Cited

U.S. PATENT DOCUMENTS

| | | |
|---|---|---|
| 3,878,542 A | 4/1975 | Myer |
| 4,335,398 A | 6/1982 | Yamada |
| 4,835,688 A | 5/1989 | Kimura |
| 6,308,295 B1 | 10/2001 | Sridharan et al. |
| 8,014,361 B2 | 9/2011 | Ozluturk |
| 8,281,213 B1 | 10/2012 | Matache et al. |
| 8,286,049 B1 * | 10/2012 | McFarland ......... H03M 7/3084 714/751 |

(Continued)

OTHER PUBLICATIONS

Zhang, Xinmiao et al. "Encoder with Transform Architecture for LDPC Codes Over Subfields Using Message Mapping," U.S. Appl. No. 14/316,117, filed Jun. 26, 2014, 38 pages.

(Continued)

*Primary Examiner* — Daniel McMahon
(74) *Attorney, Agent, or Firm* — Toler Law Group, PC (57) ABSTRACT

A quasi-cyclic low-density parity-check (QC-LDPC) encoder includes a Fourier transform circuit configured to receive an input message and to generate a transformed message based on the input message. The transformed message includes leading symbols with indices corresponding to leading elements of cyclotomic cosets of a finite field with respect to a subfield. The QC-LDPC encoder further includes a matrix multiplier circuit configured to multiply the leading symbols of the transformed message by leading symbols of a transformed LDPC generator matrix to generate leading symbols of transformed parity symbols associated with an LDPC codeword. The QC-LDPC encoder is configured to provide the leading symbols of the transformed parity symbols to an inverse Fourier transform circuit to generate parity information of the LDPC codeword.

20 Claims, 4 Drawing Sheets

(56) References Cited

U.S. PATENT DOCUMENTS

| | | | |
|---|---|---|---|
| 2007/0067695 A1* | 3/2007 | Griesser | H03M 13/2906 714/755 |
| 2008/0025424 A1* | 1/2008 | Yang | H04L 1/0045 375/260 |
| 2010/0100790 A1* | 4/2010 | Sutskover | H03M 13/116 714/752 |
| 2011/0252286 A1* | 10/2011 | Li | H03M 13/1114 714/755 |
| 2012/0110418 A1 | 5/2012 | Ma | |
| 2012/0257895 A1* | 10/2012 | Djordjevic | H04B 10/548 398/65 |
| 2013/0173988 A1* | 7/2013 | Chen | H03M 13/1125 714/758 |
| 2014/0006850 A1* | 1/2014 | Aliev | G06F 11/2053 714/6.24 |
| 2014/0040532 A1 | 2/2014 | Watanabe et al. | |
| 2015/0301985 A1* | 10/2015 | Zhang | G06F 17/14 708/403 |
| 2015/0381204 A1 | 12/2015 | Zhang et al. | |
| 2015/0381205 A1 | 12/2015 | Zhang et al. | |

OTHER PUBLICATIONS

Tarable, Alberto et al. "Mapping Interleaving Laws to Parallel Turbo and LDPC Decoder Architectures," IEEE Transactions on Information Theory, vol. 50, No. 9, Sep. 2004, pp. 2002-2009.

Hocevar, Dale E. "A Reduced Complexity Decoder Architecture Via Layered Decoding of LDPC Codes," IEEE Workshop on Signal Processing Systems, Oct. 2004, pp. 107-112.

Neeb, Christian et al. "Network-on-Chip-Centric Approach to Interleaving in High Throughput Channel Decoders," IEEE International Symposium on Circuits and Systems, vol. 2, May 2005, pp. 1766-1769.

Li, Zongwang et al. "Efficient Encoding of Quasi-Cyclic Low-Density Parity-Check Codes," IEEE Transactions on Communications, vol. 54, Issue1, Jan. 2006, pp. 71-81.

Gunnam, Kiran et al. "Multi-Rate Layered Decoder Architecture for Block LDPC Codes of the IEEE 802.11n Wireless Standard," IEEE International Symposium on Circuits and Systems, May 2007, pp. 1645-1648.

Darabiha, Ahmad et al. "Power Reduction Techniques for LDPC Decoders," IEEE Journal of Solid-State Circuits, vol. 43, No. 8, Aug. 2008, pp. 1835-1845.

Lee, Kihoon et al. "A High-Speed Low-Complexity Concatenated BCH Decoder Architecture for 100 Gb/s Optical Communications," Springer Science+Business Media, LLC, Aug. 2010, 13 pages.

Huang, Q. et al. "A Low-Complexity Encoding of Quasi-Cyclic Codes Based on Galois Fourier Transform," Cornell University Library, arXiv.org > cs > arXiv:1301.3220v1, submitted Jan. 15, 2013, 8 pages.

Huang, Q. et al. "Low-Complexity Encoding of Quasi-Cyclic Codes Based on Galois Fourier Transform," IEEE Transactions on Communications, vol. 62, Issue 6, Jun. 2014, 10 pages.

Zhang, Xinmiao et al. "High-Speed Multi-Block-Row Layered Decoder for Low Density Parity Check (LDPC) Codes," U.S. Appl. No. 14/257,800, filed Apr. 21, 2014, 41 pages.

Zhang, Xinmiao et al. "Low Complexity Partial Parallel Architectures for Fourier Transform and Inverse Fourier Transform Over Subfields of a Finite Field," U.S. Appl. No. 14/258,679, filed Apr. 22, 2014, 44 pages.

Zhang, Xinmiao "Interleaved Layered Decoder for Low-Density Parity Check Codes," U.S. Appl. No. 14/258,843, filed Apr. 22, 2014, 34 pages.

Zhang, Xinmiao "Modified Trellis-Based Min-Max Decoder for Non-Binary Low-Density Parity-Check Error-Correcting Codes," U.S. Appl. No. 14/272,621, filed May 8, 2014, 33 pages.

Ex-Parte Quayle Action mailed Feb. 16, 2016 in U.S. Appl. No. 14/316,117, 5 pages.

Notice of Allowance and Fee(s) Due mailed Apr. 28, 2016 in U.S. Appl. No. 14/316,117, 5 pages.

Non-Final Office Action mailed May 10, 2016 in U.S. Appl. No. 14/258,679, 6 pages.

\* cited by examiner

ENCODER FOR QUASI-CYCLIC LOW-DENSITY PARITY-CHECK CODES OVER SUBFIELDS USING FOURIER TRANSFORM

FIELD OF THE DISCLOSURE

The present disclosure is generally related to low-density parity-check (LDPC) encoders.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, multi-level cell (MLC) flash memory devices provide increased storage density by storing 2 bits per cell, 3 bits per cell, 4 bits per cell, or more. Although increasing the number of bits per cell and reducing device feature dimensions may increase the storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. Conventionally, encoding data to generate an ECC codeword, such as a quasi-cyclic low-density parity-check (QC-LDPC) codeword, includes multiplying the data with a generator matrix. A systematic QC-LDPC generator matrix includes a parity portion composed of circulant matrices. Because each row of a circulant matrix is a cyclically shifted version of the previous row of the circulant matrix, QC-LDPC encoding may be simplified using a shift-register type encoder architecture. However, due to a relatively high density of non-zero entries in irregular locations in the parity portion of a QC-LDPC generator matrix, QC-LDPC encoders conventionally include a dedicated multiplier circuit for each column of the parity portion for multiplying a message symbol with the generator matrix in order to reduce encoding latency.

To reduce the number of multipliers used in a QC-LDPC encoder, a Fourier transform of the generator matrix over a finite field may be used. Because the Fourier transform of a circulant matrix is a diagonal matrix, non-zero entries are only located along the matrix diagonal and a reduced number of multipliers may be used, with one dedicated multiplier for each block column of circulant matrices in the parity portion of the generator matrix for multiplying a message symbol with the generator matrix. However, multiplying an input message (e.g., data to be encoded) with the Fourier transform of the generator matrix results in an output codeword with symbols that are elements of the finite field corresponding to the transformed generator matrix (e.g., Galois field $GF(2^6)$), rather than of the input message (e.g., a "binary" message with symbols that are elements of $GF(2)$).

In order to obtain a binary codeword using a Fourier transform of the generator matrix of a QC-LDPC code, additional processing has been previously proposed that is applied to the input message and to the transformed generator matrix. However, the proposed additional processing includes performing permutations of rows and columns of the transformed generator matrix and also processing the input message by linearly combining together elements that appear in different "blocks" of the input message (i.e., sections of the input message that correspond to different circulant matrices in the generator matrix) to generate a mapped message. In addition, a reverse permutation of the product of the mapped message and the permuted transformed generator matrix is required to obtain a codeword. The multiple permutations add additional complexity and latency of encoding, and the message mapping across multiple "blocks" further increases latency and storage requirements because large portions or all of the input message have to be received and stored before message mapping can be completed. Another drawback of the previously proposed encoding process is that it is limited to binary LDPC codes and is not applicable to non-binary LDPC codes.

SUMMARY

A quasi-cyclic low-density parity-check (QC-LDPC) encoder multiplies leading symbols of a Fourier transform of an input message with leading symbols of a Fourier transform of an LDPC generator matrix to generate transformed leading parity symbols associated with a QC-LDPC code. The leading symbols have indices corresponding to leading elements of cyclotomic cosets of a finite field with respect to a subfield. A reduced number of dedicated multipliers may be used as compared to non-transform QC-LDPC encoders without reduction of decoding throughput. Because the Fourier transform of the QC-LDPC generator matrix is used instead of a permuted version of the Fourier transform of the QC-LDPC generator matrix, additional latency, complexity, and buffering associated with post-multiplication reverse permutation and inter-block message mapping may be avoided. Additional reduction in computational complexity may be achieved by exploiting properties of the cyclotomic cosets of the finite field with respect to the sub-field. To illustrate, a generator matrix multiplication operation may include multiplying leading symbols of a transformed input message (i.e., symbols having indices corresponding to leading elements of the cyclotomic cosets) with leading symbols of the generator matrix to generate a result that includes fewer symbols than the input message. The QC-LDPC encoder may conserve power because the inverse Fourier transform is carried out only on the transformed parity symbols. Further, the resulting QC-LDPC codes may be binary or non-binary.

DETAILED DESCRIPTION

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. In this case, low-density parity-check (LDPC) codes may be utilized to improve reliability of communications (wired or wireless).

Conventionally, the encoding of LDPC codes is performed according to c=mG, where c is the resulting codeword, m is the message (e.g., a vector of message symbols) and G is a generator matrix. A systematic generator matrix for a quasi-cyclic low-density parity-check (QC-LDPC) code can be expressed as:

$$G = \begin{bmatrix} I & 0 & \cdots & 0 & G_{0,0} & \cdots & G_{0,n-k-1} \\ 0 & I & \cdots & 0 & G_{1,0} & \cdots & G_{1,n-k-1} \\ \vdots & \vdots & \ddots & \vdots & \vdots & \ddots & \vdots \\ 0 & 0 & \cdots & I & G_{k-1,0} & \cdots & G_{k-1,n-k-1} \end{bmatrix} \quad \text{Eq. 1}$$

where I is the identity matrix and $G_{i,j}$ ($0 \le i < k$, $0 \le j < n-k$) are circulant matrices of the same size as the identity matrix. The non-identity portion of G (i.e., the columns of G that consist of $G_{i,j}$ submatrices) is also referred to as the parity portion of G. In a circulant matrix, each row is the previous row cyclically shifted by one position. Due to this property of circulant matrices, the encoder of a QC-LDPC code can be implemented by a shift-register architecture. However, the matrices $G_{i,j}$ are relatively dense, and nonzero entries in each row of $G_{i,j}$ appear at irregular locations. Therefore, in conventional encoders a dedicated multiplier is used for each parity column for multiplying a message symbol with the generator matrix, and (n−k)e multipliers are used to multiply a message symbol by G, when the dimension of each submatrix is e×e.

A Fourier-transformed method has been proposed to reduce the encoder complexity of QC-LDPC codes. In the following example, the size of the circulant submatrices in G is $e=(2^r-1)$, where r is a positive integer, a is a primitive element of finite field $GF(2^r)$, and $V=[\alpha^{-ij}]$ ($0 \le i, j < e$) is an e×e matrix over $GF(2^r)$, whose entry in the ith row and jth column is $\alpha^{ij}$. The Fourier transform of an e-tuple vector, $w=[w0, w1, \ldots, w_{e-1}]$, denoted as F(w), can be computed as:

$$F(w) = wV = w \begin{bmatrix} 1 & 1 & 1 & 1 & \cdots \\ 1 & \alpha^{-1} & \alpha^{-2} & \alpha^{-3} & \cdots \\ 1 & \alpha^{-2} & \alpha^{-4} & \alpha^{-8} & \cdots \\ \vdots & \vdots & \vdots & \vdots & \ddots \\ 1 & \alpha^{-(e-1)} & \alpha^{-(e-2)} & \alpha^{-(e-3)} & \cdots \end{bmatrix} \quad \text{Eq. 2}$$

The inverse of V is $V^{-1}=[\alpha^{ij}]$, and the inverse Fourier transform of a vector w is computed as $$F^{-1}(w) = wV^{-1} = w \begin{bmatrix} 1 & 1 & 1 & 1 & \cdots \\ 1 & \alpha & \alpha^2 & \alpha^3 & \cdots \\ 1 & \alpha^2 & \alpha^4 & \alpha^8 & \cdots \\ \vdots & \vdots & \vdots & \vdots & \ddots \\ 1 & \alpha^{e-1} & \alpha^{e-2} & \alpha^{e-3} & \cdots \end{bmatrix} \quad \text{Eq. 3}$$

If W is a circulant matrix and the first row of W is w, then $$W^F = V^{-1}WV = \text{diag}(d_0, d_1, \ldots, d_{e-1}) \quad \text{Eq. 4}$$

where $[d_0, d_1, \ldots, d_{e-1}]$ equals F(w). The diagonal matrix $W^F$ is called the Fourier transform of the circulant matrix W. $V^{-1(k)}$ is defined as a k×k diagonal array of $V^{-1}$, and $V^{(n)}$ is defined as an n×n diagonal array of V. The Fourier transform of G is defined as $G^F = V^{-1(k)} G V^{(n)}$. Transformed encoding in the proposed Fourier-transformed method is performed according to:

$$c = c^F V^{-1(n)} = (mG^F) V^{-1(n)}. \quad \text{Eq. 5}$$

The codeword 'c' computed using Eq. 5 is different from mG. However, c also satisfies the equality $cH^T = 0$, where H is the parity-check matrix of the LDPC code. Therefore, the codeword c computed using Eq. 5 is also a valid codeword. In the transformed generator matrix $G^F$, the first ke columns are an identity matrix, and the last (n−k)e columns for the parity bits are diagonal matrices of dimension e×e. As a result, multiplying a message symbol with $G^F$ may be performed using n−k multipliers over $GF(2^r)$, as compared to the (n−k)e multipliers of non-transformed conventional encoders.

Even if m is over a subfield of $GF(2^r)$, the codeword c computed according to Eq. 5 is over $GF(2^r)$ (i.e., c includes symbols that are elements of $GF(2^r)$), unless conjugacy constraints are satisfied in each block of e symbols in the transformed codeword $c^F$. The proposed Fourier-transformed method focuses on the case that m is binary. An e-tuple vector w is binary if and only if the symbols in its Fourier transform d=F(w) satisfy the conjugacy constraints:

$$d_{(2i)e} = d_i^2 \quad \text{Eq. 6}$$

where $(2i)_e$ denotes 2i modulo e. To make the encoder output binary for binary messages, the proposed Fourier-transformed method includes permuting $G^F$ and carrying out mappings on m. The rows of $G^F$ are permuted according to $$\pi_{row} = [0, e, 2e, \ldots, (k-1)e, 1, e+1, 2e+1, \ldots, (k-1)e+1, e-1, 2e-1, \ldots, ke-1]. \quad \text{Eq. 7}$$

The permutation results in row e of $G^F$ becoming the second row after permutation, row 2e of $G^F$ becoming the third row after permutation, etc. The columns of $G^F$ are also permuted in a similar way. The row-and-column-permuted transformed generator matrix $G^{F,\pi}$ is zero except for e nonzero matrices of dimension k×n in the diagonal. In addition, an e-tuple vector formed by the entries in the same row and column inside each of these e submatrices satisfies the conjugacy constraints, such that the conjugacy constraints are satisfied in an "inter-block" manner. The input message m is also divided into e blocks of k messages and mapped to m̂ to satisfy the conjugacy constraints in an inter-block manner. The indexes of the elements that satisfy the conjugacy constraints form cyclotomic cosets $\{i, (2i)e, (2^2 i)e, \ldots, (2^{n_i-1} i)e\}$. The cardinality of each cyclotomic coset, $\eta_i$, is a divisor of r. Using $\{\beta_{i,0}, \beta_{i,1}, \ldots \beta_{i,\eta_i-1}\}$ as a basis of the subfield $GF(2^{\eta_i})$, the message mapping for each cyclotomic coset and $\mu=0, 1, \ldots, \eta_i-1$, $j=0, 1, \ldots, k-1$ is performed according to:

$$\hat{m}_{(2^\mu i)_e k+j} = (\Sigma_{l=0}^{\eta_i-1} \beta_{i,l} m_{(2^l i)_e k+j})^{2^\mu}. \quad \text{Eq. 8}$$

$\hat{m}G^{F,\pi}$ satisfies the conjugacy constraints in an inter-block manner. If reversely permuted, $\hat{m}G^{F,\pi}$ would become a vector that satisfies the conjugacy constraints in an intra-block manner, i.e. each block of e consecutive symbols satisfies the conjugacy constraints. As a result, a binary codeword can be derived as follows:

$$c = \hat{c}^{F,\pi^{-1}} V^{-1(n)} = (\hat{m} G^{F,\pi})^{\pi^{-1}} V^{-1(n)}. \quad \text{Eq. 9}$$

It should be noted that the codeword c computed according to Eq. 9 is different from the codeword mG generated according to conventional non-Fourier transformed methods. However, the codeword c computed according to Eq. 9 is a valid codeword.

Despite the benefit of the proposed Fourier-transformed encoding of Eq. 9—that the number of multipliers for computing $\hat{m}G^{F,\pi}$ is reduced as compared to the number of multipliers used for calculating mG—the Fourier-transformed encoding according to Eq. 9 has several drawbacks. For example, the permutation of $G^F$ and the reverse permutation of $\hat{c}^F$ complicate their storage and access. Also, inter-block message mapping is needed to derive $\hat{m}$ according to the conjugacy constraints of Eq. 8. Because the indices in a cyclotomic coset can be far apart, a large number of blocks of input messages have to be buffered such that a sufficient portion of the input message m is available to generate each symbol of the mapped message $\hat{m}$. In addition to the message mapping of Eq. 8, a reverse mapping is also needed in a decoder to recover the original message m. The overhead introduced by the message mapping of Eq. 8 may offset any savings resulting from the less-complicated multiplication of $\hat{m}$ by $G^{F,\pi}$ of the proposed Fourier-transform encoding method according to Eq. 9. In addition, the proposed Fourier-transform encoding method according to Eq. 9 is limited to binary LDPC codes.

Figure 1:
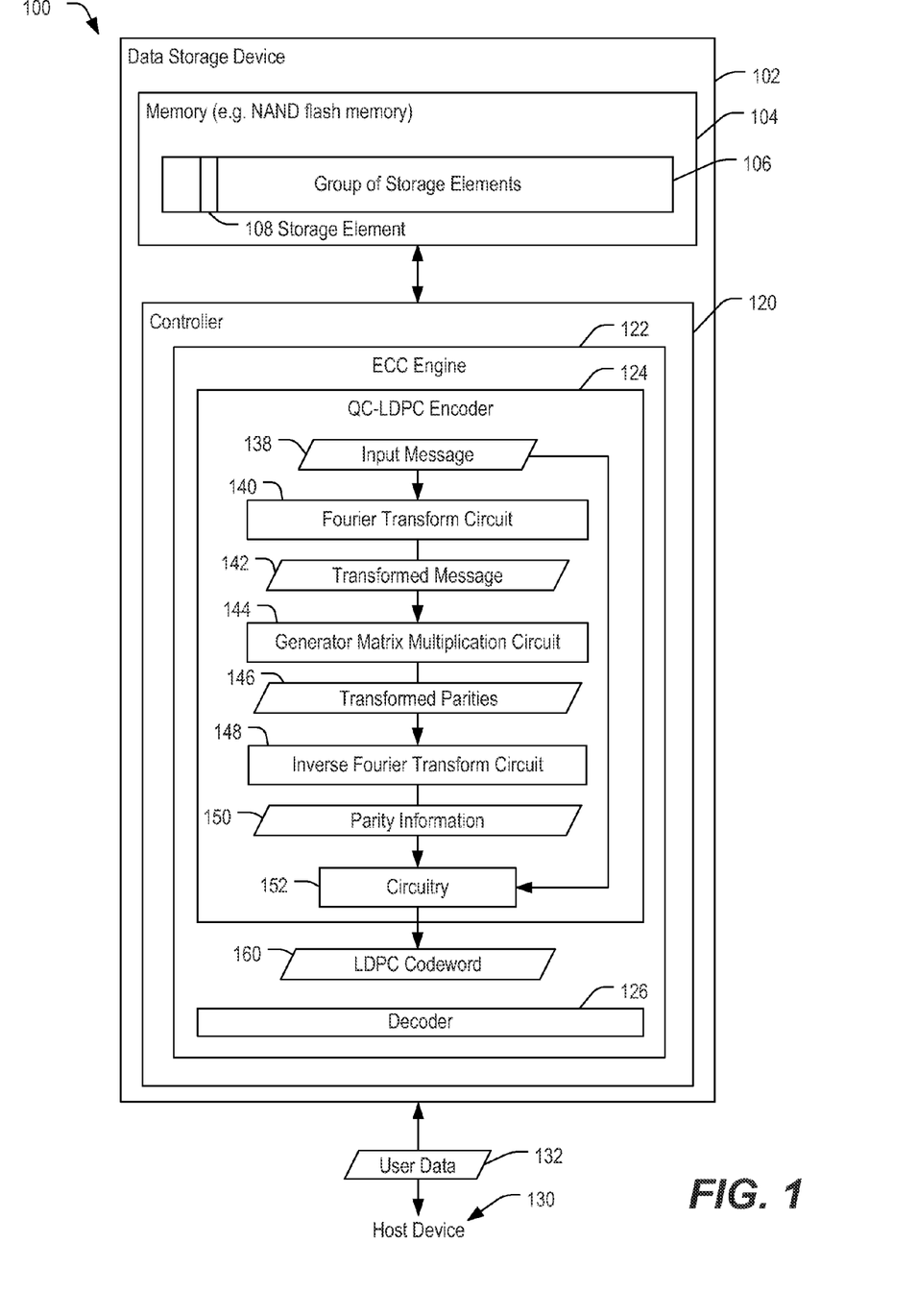
FIG. 1 is a block diagram of a particular illustrative embodiment of a system including a data storage device having a quasi-cyclic low-density parity-check (QC-LDPC) encoder.

Referring to FIG. 1, a particular illustrative embodiment of a system is depicted and generally designated 100. The system 100 includes a data storage device 102 and a host device 130. The data storage device 102 and the host device 130 may be coupled via a connection, such as a bus or a wireless connection. The data storage device 102 may be embedded within the host device 130, such as in accordance with a Joint Electron Devices Engineering Council (JEDEC) Solid State Technology Association Universal Flash Storage (UFS) configuration. Alternatively, the data storage device 102 may be removable from the host device 130. As an example, the data storage device 102 may be removably coupled to the host device 130 in accordance with a removable universal serial bus (USB) configuration.

The data storage device 102 may include a memory 104. The memory 104 may include a non-volatile memory, such as a non-volatile NAND flash memory or a non-volatile resistive random access memory (ReRAM). The memory 104 may have a three-dimensional (3D) memory configuration. As an illustrative example, the memory 104 may include one or more layers having a first orientation and may further include one or more elements, such as vertical columns, having a second orientation perpendicular to (or approximately perpendicular to) the first orientation to enable cross-layer coupling of storage elements of the one or more layers. Alternatively, the memory 104 may have another configuration, such as a two-dimensional (2D) memory configuration. In a particular implementation, the memory 104 is a non-volatile memory having a three-dimensional (3D) memory configuration that is monolithically formed in one or more physical levels of arrays of memory cells having an active area disposed above a silicon substrate. The data storage device 102 may include circuitry, such as read/write circuitry at the memory 104, that is associated with operation of the memory cells.

The memory 104 may include one or more physical pages of storage elements (e.g., word lines of storage elements). The physical pages may be included in one or more blocks (e.g., an erase group of word lines) of the memory 104. The memory 104 may include multiple blocks of physical pages. The physical pages may each store data. To illustrate, one or more of the physical pages may correspond to a physical page of single-level cell (SLC) storage elements that can be programmed using to store threshold voltages indicating bit values of a logical page, such as in connection with a one-bit-per-cell ("X1") configuration. Alternatively, one or more of the physical pages may correspond to a physical page of multi-level cell (MLC) storage elements that can be programmed to store threshold voltages indicating bit values of multiple logical pages, such as in connection with a two-bit-per-cell ("X2") configuration or a three-bit-per-cell ("X3") configuration, as illustrative examples. The memory 104 includes a representative group 106 of storage elements, such as a word line of storage elements. The group 106 includes a representative storage element 108, such as a flash storage element.

The data storage device 102 may further include a controller 120. The memory 104 and the controller 120 may be operationally coupled via a connection, such as a bus. The controller 120 may include an error correcting code (ECC) engine 122 that includes a quasi-cyclic low-density parity-check (QC-LDPC) encoder 124 and a decoder 126.

The QC-LDPC encoder 124 includes a Fourier transform circuit 140, a generator matrix multiplication circuit 144, an inverse Fourier transform circuit 148, and circuitry 152. An output of the Fourier transform circuit 140 may be coupled to an input of the generator matrix multiplication circuit 144. An output of the generator matrix multiplication circuit 144 may be coupled to an input of the inverse Fourier transform circuit 148. An output of the inverse Fourier transform circuit 148 may be coupled to an input of the circuitry 152. The circuitry 152 may include selection logic, such as a multiplexer (MUX).

The controller 120 is configured to receive data and instructions from the host device 130 and to send data to the host device 130. The controller 120 is configured to send data and commands to the memory 104 and to receive data from the memory 104. For example, the controller 120 is configured to send data and a write command to cause the memory 104 to store the data to a specified address of the memory 104, such as a physical address corresponding to the group 106. The controller 120 is configured to send a read command to read data from a specified address of the memory 104, such as a physical address corresponding to the group 106.

The host device 130 may correspond to a mobile telephone, a computer, (e.g., a laptop, a tablet, or a notebook computer), a music player, a video player, a gaming device or console, an electronic book reader, a personal digital assistant (PDA), a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification as an illustrative example. Alternatively, the host device 130 may communicate with the data storage device 102 in accordance with another communication protocol.

In operation, the controller 120 may receive data to be stored at the memory 104. For example, the controller 120 may receive a request for write access from the host device 130 to write user data 132 at the memory 104. In response to receiving the user data 132, the controller 120 may input the user data 132 to the QC-LDPC encoder 124 to encode the user data 132. The QC-LDPC encoder 124 may encode the data using a QC-LDPC encoding technique. For example, the controller 120 may input the user data 132 at the QC-LDPC encoder 124, and the QC-LDPC encoder 124 may encode the data using a QC-LDPC encoding technique to generate an LDPC codeword, such as a representative LDPC codeword 160. The LDPC codeword 160 may be formed of binary symbols or non-binary symbols.

To generate the LDPC codeword 160, the ECC engine 122 may initiate an encoding process by inputting an input message 138 at the QC-LDPC encoder 124. The input message 138 may be based on the user data 132. For example, the input message 138 may correspond to a portion of the user data 132 that is to be stored at a location of the memory 104, such as at the group 106.

The Fourier transform circuit 140 may be configured to receive the input message 138 and to generate a transformed message 142 based on the input message 138. For example, the Fourier transform circuit 140 may perform a Fourier transform operation using the input message 138 to generate the transformed message 142.

The generator matrix multiplication circuit 144 may be responsive to the transformed message 142. For example, the generator matrix multiplication circuit 144 may multiply the leading symbols of the transformed message 142 corresponding to cyclotomic cosets with the leading symbols in the transformed LDPC generator matrix to generate the leading symbols of parity information, such as transformed parities 146.

The QC-LDPC encoder 124 may be configured to provide the transformed parities 146 to the inverse Fourier transform circuit 148. The inverse Fourier transform circuit 148 may be configured to generate parity information 150, such as by performing an inverse Fourier transform operation using the transformed parities 146 to generate the parity information 150.

Because the generator matrix multiplication circuit 144 is configured to multiply the leading symbols of the transformed message 142 with the leading symbols in the transformed LDPC generator matrix, the transformed parities 146 may include only the leading symbols of the parities. The QC-LDPC encoder 124 may be further configured to generate the non-leading symbols of the transformed parities. For example, in some implementations, the QC-LDPC encoder 124 may be configured to generate the non-leading transformed parity symbols based on the (leading) transformed parities 146. In this case, the QC-LDPC encoder 124 may be configured to input both the leading and non-leading symbols of the transformed parities to the inverse Fourier transform circuit 148. Here, the inverse Fourier transform circuit 148 may be configured to perform a conventional inverse Fourier transform operation to generate the parity information 150.

In another example implementation, only the leading symbols of the transformed parities 146 are input to the inverse Fourier transform circuit 148. For example, the inverse Fourier transform circuit 148 may implement an efficient architecture for an inverse Fourier transform using the transformed parities 146. To illustrate, the inverse Fourier transform circuit 148 may operate on the leading parity symbols. In such implementations, direct computation of parity values corresponding to the non-leading symbols prior to the inverse Fourier transform circuit 148 may be omitted. Regardless of whether only the leading symbols or both the leading and non-leading symbols are input to the inverse Fourier transform circuit 148, the outputs of the inverse Fourier transform circuit 148 are blocks of e symbols.

The circuitry 152 may be responsive to the parity information 150. The circuitry 152 may be configured to combine the parity information 150 with the encoder input message (i.e., the input message 138 in the example of FIG. 1) to generate the LDPC codeword 160. For example, the circuitry 152 may be configured to concatenate the parity information 150 with the input message 138 to generate the LDPC codeword 160. In the example of FIG. 1, the Fourier transform circuit 140 and the circuitry 152 are each configured to receive the input message 138.

The Fourier transform circuit 140 may be configured to receive k blocks of symbols of the input message 138, where k indicates a positive integer number. In a particular embodiment, the inverse Fourier transform circuit 148 is configured to receive n−k blocks of symbols of the transformed parities 146, where n indicates a positive integer number that is greater than k. Because n may be only slightly larger than k in certain applications (e.g., in connection with a high code rate encoder), applying an inverse Fourier transform to n−k blocks of symbols may reduce computational complexity of an encoder and may conserve power as compared to applying an inverse Fourier transform to n blocks of symbols.

The QC-LDPC encoder 124 may output the LDPC codeword 160, such as by outputting the LDPC codeword 160 to data latches of the memory 104. The memory 104 may store the LDPC codeword 160, such as at the group 106. The group 106 can be accessed by the controller 120, such as in response to a request for read access received from the host device 130. In this case, the controller 120 may cause read/write circuitry of the memory 104 to sense the group 106 to generate a word that is received at by the controller 120. The received word can be input to the decoder 126 to correct one or more errors that may be present in the received word. Decoding the received word may generate user data, such as the user data 132, which the controller 120 may provide to the host device 130.

The example of FIG. 1 illustrates QC-LDPC encoding techniques that simplify operation of an encoder. For example, because a Fourier transform of a QC-LDPC generator matrix is used instead of a permuted version of the Fourier transform of the QC-LDPC generator matrix, latency, complexity, and buffering associated with post-multiplication reverse permutation and inter-block message mapping may be avoided. Further, the example of FIG. 1 illustrates that encoder operation can be simplified using a transformed representation of an input message instead of using a mapped message. In this case, an inverse Fourier transform may be applied to a parity portion of an LDPC codeword without applying the inverse Fourier transform to a systematic portion of the LDPC codeword, which may enable power reduction in some applications (e.g., to reduce a die size of an integrated circuit that includes the QC-LDPC encoder 124).

To further illustrate, the QC-LDPC encoder 124 has reduced complexity as compared to the transformed Fourier encoding scheme based on Eq. 9. For an input message having symbols over a subfield $GF(2^p)$, codeword symbols should also be over $GF(2^p)$ in order to save storage space. However, if the size of the circulant submatrix in the generator matrix G is $e=2^r-1$, then entries in the transformed generator matrix $G^F$ are symbols over $GF(2^r)$. An $e=2^r-1$ tuple vector w is over subfield $GF(2^p)$ if and only if the symbols in its Fourier transform $d=F(w)$ satisfy the following conjugacy constraints:

$$d_{(2^p i)_e} = d_i^{2^p}.$$  Eq. 10:

To make the encoding output over $GF(2^p)$, the input to the inverse Fourier transform should satisfy the conjugacy constraints. Since the entries in each of the diagonal submatrices of $G^F$ already satisfy the conjugacy constraints, a message vector to be multiplied with $G^F$ should satisfy the conjugacy constraints. One technique may include mapping an input message m to a mapped message $\overline{m}$ that satisfies the conjugacy constraints using a basis.

Another vector that satisfies the conjugacy constraints is $m^F$, which may be derived by applying a Fourier transform to each block of e symbols in m. In this example, $m^F G^F$ also satisfies the conjugacy constraints, and encoding may be performed according to $$c = m^F G^F V^{-1(n)}. \qquad \text{Eq. 11}$$

An encoding process that uses Eq. 11 may result in a unique codeword c that differs from codewords generated using other techniques. However, the codeword c is a valid codeword. To prove that the codeword c is valid, it is sufficient to show that $cH^T=0$, where H indicates the parity-check matrix of the code, and where H satisfies $GH^T=0$. Because $G^F = V^{-1(k)} G V^{(n)}$, $$cH^T = m^F G^F V^{-1(n)} H^T = \\ m^F V^{-1(k)} G V^{(n)} V^{-1(n)} H^T = m^F V^{-1(k)} G H^T = 0. \qquad \text{Eq. 12}$$

The first ke block column of the transformed generator matrix $G^F$ is also an identity matrix. Therefore, the first k blocks of e symbols in c can be computed according to:

$$m^F I V^{-1(k)} = m V^{(k)} I V^{-1(k)} = m. \qquad \text{Eq. 13}$$

As a result, the Fourier transform and inverse Fourier transform for computing the systematic part of the codeword are canceled out, and the message symbols directly become the systematic part. The inverse Fourier transform may be applied only to parity symbols. Thus, by performing the inverse Fourier transform only to parity symbols, an inverse Fourier transform may be applied to n–k blocks of e symbols (instead of to n blocks of e symbols). Advantageously, the resulting codeword may be decoded using a conventional decoding technique (e.g., the decoder 126 of FIG. 1 may be configured to operate in accordance with a conventional LDPC decoding process).

Figure 2:
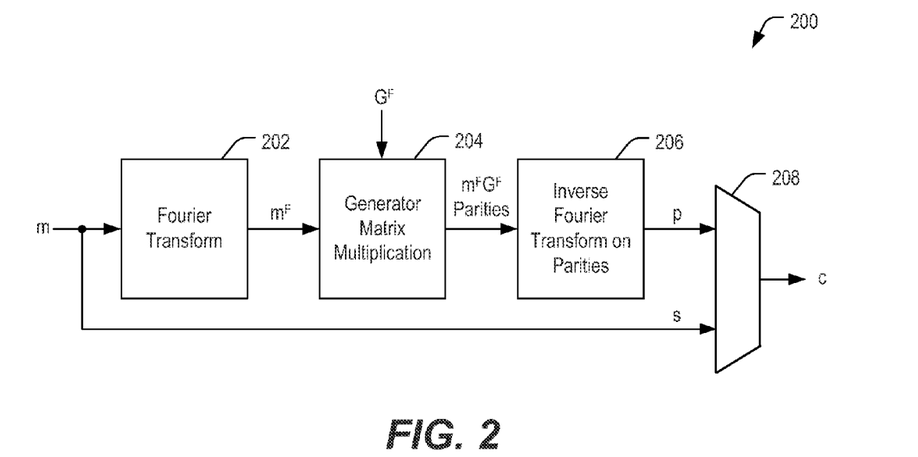
FIG. 2 is a data flow diagram illustrating particular example operations that may be performed by the QC-LDPC encoder of FIG. 1.

FIG. 2 is a data flow diagram illustrating particular example operations 200 of an encoder. The operations 200 may be performed by the QC-LDPC encoder 124 of FIG. 1.

The operations 200 may include a Fourier transform operation 202 using an input message m. Performing the Fourier transform operation 202 may generate a transformed message $m^F$. In a particular embodiment, the input message corresponds to the input message 138, the transformed message corresponds to the transformed message 142, and the Fourier transform operation 202 is performed by the Fourier transform circuit 140 of FIG. 1.

The operations 200 may further include a generator matrix multiplication operation 204 that multiplies leading symbols of the transformed message with leading symbols of a transformed LDPC generator matrix $G^F$ to generate transformed leading parity symbols of parity information p associated with an LDPC codeword c (i.e., to generate transformed leading parity symbols of $m^F G^F$). In a particular embodiment, the transformed leading parity symbols are the same as the transformed parities 146, the LDPC codeword is the same as the LDPC codeword 160, and the generator matrix multiplication operation 204 is performed by the generator matrix multiplication circuit 144. In a particular embodiment, the transformed leading parity symbols are combined with transformed non-leading parity symbols. In this case, both the transformed leading parity symbols and the transformed non-leading parity symbols may be input to a conventional inverse Fourier transform stage, which may correspond to the inverse Fourier transform circuit 148 of FIG. 1. In other examples, only the transformed leading parity symbols are input to the inverse Fourier transform stage. In this case, the inverse Fourier transform circuit 148 of FIG. 1 may be configured to implement an efficient architecture for inverse Fourier transform using the transformed leading parity symbols without using the non-leading parity symbols.

To further illustrate, the operations 200 may further include an inverse Fourier transform operation 206. For example, the transformed leading parity symbols may be inversely transformed by the inverse Fourier transform circuit 148 to generate the parity information p. The parity information may correspond to the parity information 150. The inverse Fourier transform operation 206 may correspond to a conventional inverse Fourier transform operation that uses the leading and non-leading symbols of parity information. In another example, the inverse Fourier transform operation 206 corresponds to an efficient inverse Fourier transform using only the transformed leading parity symbols as an input.

The operations 200 may further include a concatenation operation 208. For example, the parity information may be concatenated with a systematic portion s to generate the LDPC codeword. The systematic portion may correspond to the input message, as illustrated in the example of FIG. 2. In a particular embodiment, the concatenation operation 208 is performed by the circuitry 152.

The example of FIG. 2 illustrates QC-LDPC encoding techniques that simplify operation of an encoder. For example, latency, complexity, and buffering associated with post-multiplication reverse permutation and inter-block message mapping may be avoided using the techniques of FIG. 2. Further, the example of FIG. 2 illustrates that encoder operations may utilize a transformed representation of an input message instead of using a mapped message. Avoiding use of message mapping techniques may enable simplified circuitry in some applications.

Figure 3:
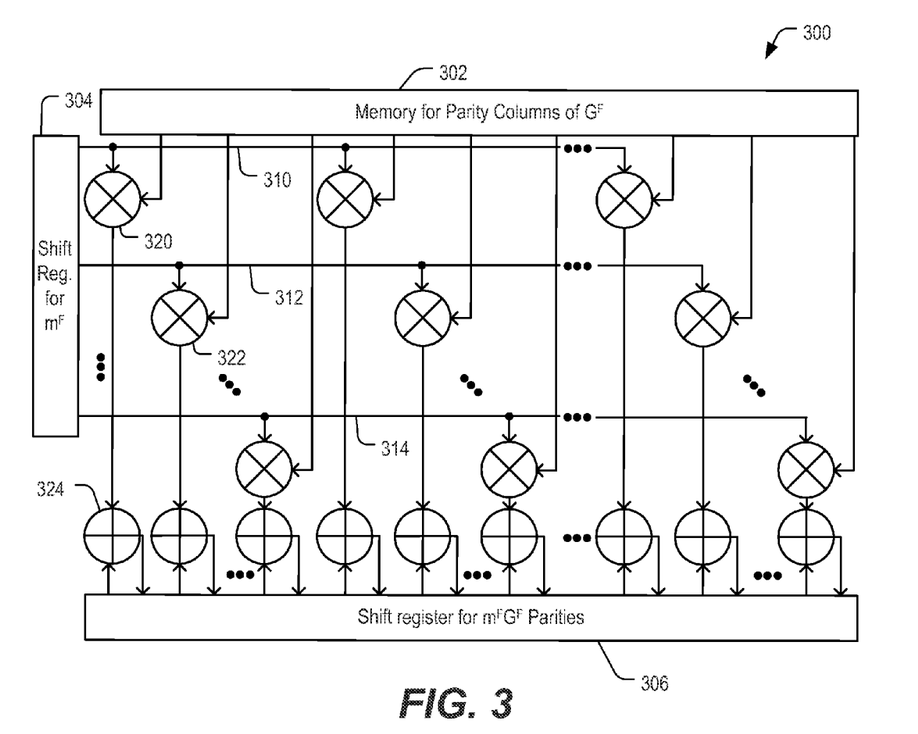
FIG. 3 is a block diagram illustrating a particular embodiment of a generator matrix multiplication circuit that may be included in the QC-LDPC encoder of FIG. 1.

FIG. 3 shows a partial-parallel architecture 300 of the generator matrix multiplication circuit 144 of FIG. 1. A memory 302 stores data corresponding to leading non-zero elements of the parity columns of the transformed LDPC generator matrix $G^F$. A shift register 304 is configured to receive symbols of the transformed message $m^F$ and to provide transformed message symbols via outputs 310-314 to a group of multiplier circuits including a first representative multiplier 320 and a second representative multiplier 322. Outputs of multipliers are coupled to first inputs of adders, such as a representative adder 324. Second inputs of the adders and outputs of the adders are coupled to a shift register 306 for storing the transformed leading parity symbols of $m^F G^F$. The shift register 306 may include multiple shift registers.

In a particular implementation, there are l' outputs 310-314 so that in each clock cycle, l' leading symbols of $m^F$ are simultaneously multiplied with all the nonzero entries in the corresponding rows of $G^F$. l' may be selected so that the throughput of the generator matrix multiplication circuit 144 matches the rate of receiving encoder input symbols in order to reduce an amount of buffers. For example, when the number of input symbols received at a time is l=8 and e=63, a block of symbols of the input message are received over ⌈63/8⌉=8 clock cycles. For reduced buffering, matrix multiplication involving the transformed symbols in a block should be completed over 8 clock cycles. In the case of p=2 and r=6, there are 23 cyclotomic cosets so that the multiplications of 23 leading symbols are completed in 8 clock cycles. Hence, the number of outputs 310-314 of the shift register 304 can be determined as l'=⌈23/8⌉=3.

Since the parity part of $G^F$ consists of n-k block columns of diagonal submatrices, n-k multipliers may be implemented for each leading symbol of $m^F$ output from the shift register 304. The intermediate products of $m^F$ and $G^F$ for all parity columns may be stored in the shift register 306. In every clock cycle, the output of each multiplier is accumulated to the intermediate result belonging to the same column of $G^F$. For example, in each clock cycle, the output of the multiplier 320 is added to the accumulated value for the particular parity column from the shift register 306 storing the transformed leading parity symbols of $m^F G^F$ and the accumulated result is stored into the shift register 306. The registers of the shift register 306 for the transformed leading parity symbols of $m^F G^F$ may be shifted by l' positions each time, so that the connections between the multipliers and registers may remain unchanged.

Components of the QC-LDPC encoder 124 may be configured to match the rate of receiving encoder input symbols, while reducing a number and size of buffers and registers used for storage during encoding. For example, if l symbols (l<e) of the input message m are input at a time, the l symbols may be stored into a shift register inside the Fourier transform circuit 140 that is configured to hold e symbols over $GF(2^p)$. After e symbols of the input message m are collected, the Fourier transform is carried out over the e symbols to generate the leading symbols of the corresponding transformed message. In the generator matrix multiplication circuit 144, the shift register 304 of FIG. 3 holding the leading symbols of $m^F$ may be sized to store e'r-bits, where e' is the number of cyclotomic cosets. The shift register 304 may shift out l' leading symbols of $m^F$ at a time (e.g., each clock cycle) that are multiplied with the entries of the parity part of the transformed generator matrix $G^F$ using the architecture 300 of FIG. 3. To reduce a size of the memory 302, the leading symbols in each diagonal submatrix of $G^F$ may be stored in the memory 302 without storing non-leading symbols of $G^F$. As explained previously, to avoid data build-up, l' may be chosen so that the number of clock cycles for the QC-LDPC encoder 124 to receive a block of the input message m equals the number of clock cycles it takes for the generator matrix multiplication circuit 144 to complete multiplication corresponding to the block of the input message m, i.e., ⌈e/l⌉=⌈e'/l'⌉.

The outputs of the generator matrix multiplication circuit 144 are parity symbols of a transformed codeword. The parity portions of the transformed codeword may be inversely transformed to generate the parity information 150, and the parity information 150 may be routed to the circuitry 152. The input message m is also routed to the circuitry 152 to become systematic symbols of the LDPC codeword 160. In some implementations, the non-leading (transformed) symbols associated with the parity information 150 may be generated prior to the inverse Fourier transform circuit 148, and the inverse Fourier transform circuit 148 may compute the parity information 150 using a conventional inverse Fourier transform circuit architecture. In other implementations, the inverse Fourier transform circuit 148 may implement an efficient architecture for inverse Fourier transform over subfields that operates on the leading parity symbols. In such implementations, there is no need to compute the non-leading symbols from those leading symbols. In either example, the output of the inverse Fourier transform circuit 148 may include blocks of e symbols.

Compared to a conventional LDPC encoder that multiplies a message vector with a generator matrix, an encoder in accordance with the present disclosure can be implemented using substantially fewer multipliers. Although an additional Fourier transform and inverse Fourier transform are implemented in the encoder as compared to a conventional LDPC encoder, the Fourier transform and inverse Fourier transform can be implemented by hardware architectures that have small silicon area and relatively low complexity by taking advantage of conjugacy constraints. Overall, the QC-LDPC encoder 124 of FIG. 1 enables significant complexity reduction as compared to a conventional LDPC encoder. Further, as noted with reference to FIG. 1, a conventional decoder may be implemented to decode codewords generated by the QC-LDPC encoder 124 (e.g., no additional circuitry or additional operations are required in the decoder 126).

To further illustrate, for a (2016, 1764) non-binary QC-LDPC code over subfield $GF(2^2)$ whose generator matrix has circulants of dimension 63×63, the QC-LDPC encoder 124 of FIG. 1 may use only 55% of the logic gates (based on architectural analysis) and slightly larger memory to achieve the same throughput as compared to a conventional LDPC encoder. For a (4064, 2921) binary QC-LDPC code whose generator matrix consists of 127×127 circulants, the QC-LDPC encoder 124 of FIG. 1 may be implemented having a gate count that is 52% less than a gate count of a conventional LDPC encoder.

Figure 4:
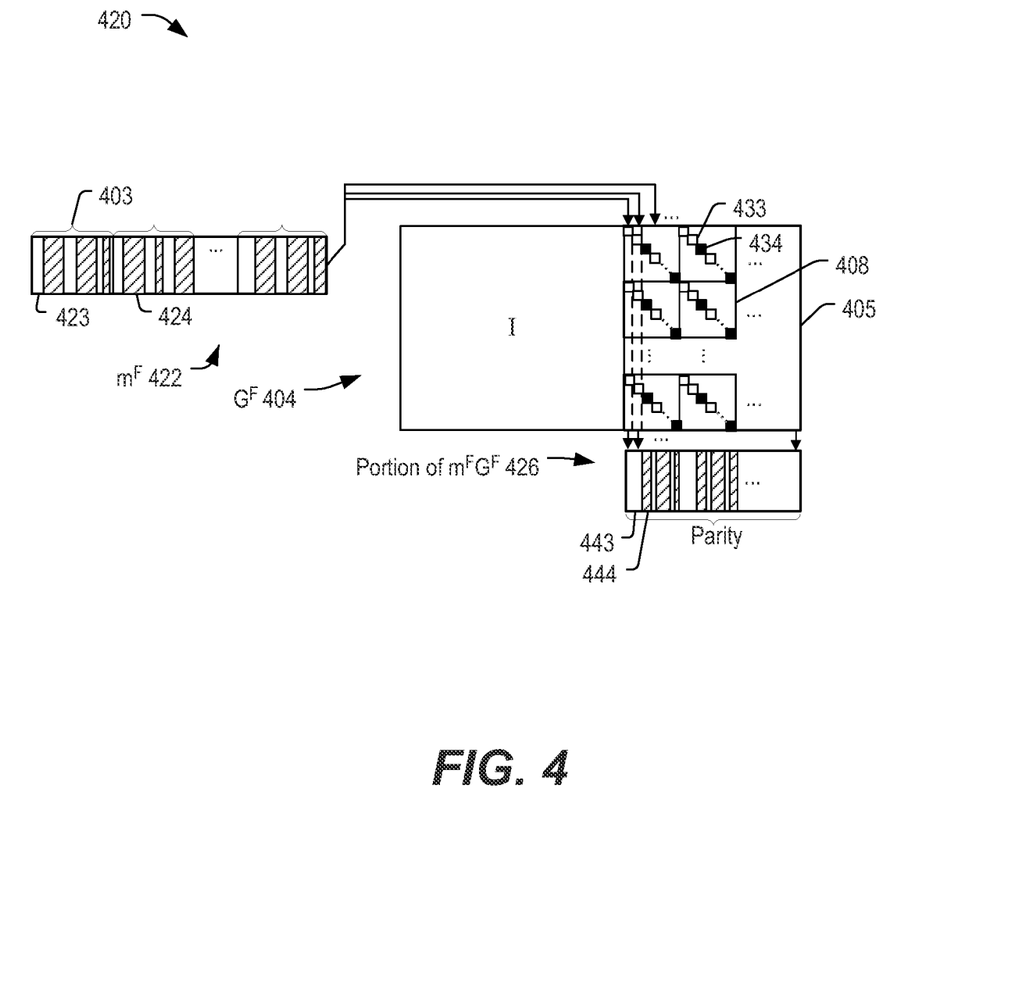
FIG. 4 is a diagram illustrating an embodiment of a matrix multiplication operation that may be performed by a generator matrix multiplication circuit that may be included in the QC-LDPC encoder of FIG. 1.

FIG. 4 depicts an illustrative multiplication operation 420 that may be performed by the generator matrix multiplication circuit 144 of FIG. 1. The multiplication operation 420 illustrates a transformed message $m^F$ 422 as including multiple blocks of symbols, such as a representative block 403. A Fourier transform of a generator matrix $G^F$ 404 includes an identity portion I and a parity portion 405. The parity portion 405 includes multiple diagonal matrices, such as a representative diagonal matrix 408. Each of the diagonal matrices has a dimension matching the size of the blocks of the transformed message $m^F$ 422.

In FIG. 4, the multiplication operation 420 omits multiplication of symbols of the transformed message $m^F$ 422 and elements of the Fourier transform of the generator matrix $G^F$ 404 that correspond to non-leading elements in each cyclotomic coset. The multiplication operation 420 may utilize symbols of the transformed message $m^F$ 422 corresponding to leading elements, illustrated as an unshaded portion 423 of the transformed message $m^F$ 422, and may omit symbols of the transformed message $m^F$ 422 corresponding to non-leading elements, illustrated as a shaded portion 424 of the transformed message $m^F$ 422. In addition, as described with respect to FIG. 3, each diagonal matrix of the parity portion 405 may include matrix elements corresponding to leading elements, illustrated as unshaded matrix elements (such as a representative unshaded element 433), and may omit matrix elements corresponding to non-leading elements, illustrated as shaded matrix elements (such as a representative shaded element 434).

The resulting portion of $m^F G^F$ 426 includes symbols corresponding to leading elements of the parity portion (e.g., an unshaded portion 443) but excludes the systematic portion and also excludes symbols corresponding to non-leading elements of the parity portion (e.g., a shaded portion 444). Because fewer multiplications are performed as compared to a conventional LDPC encoding multiplication operation and also as compared to a transformed encoder that operates according to Eq. 9, a smaller number of dedicated multipliers may be used without reducing the throughput of the overall encoder.

Figure 5:
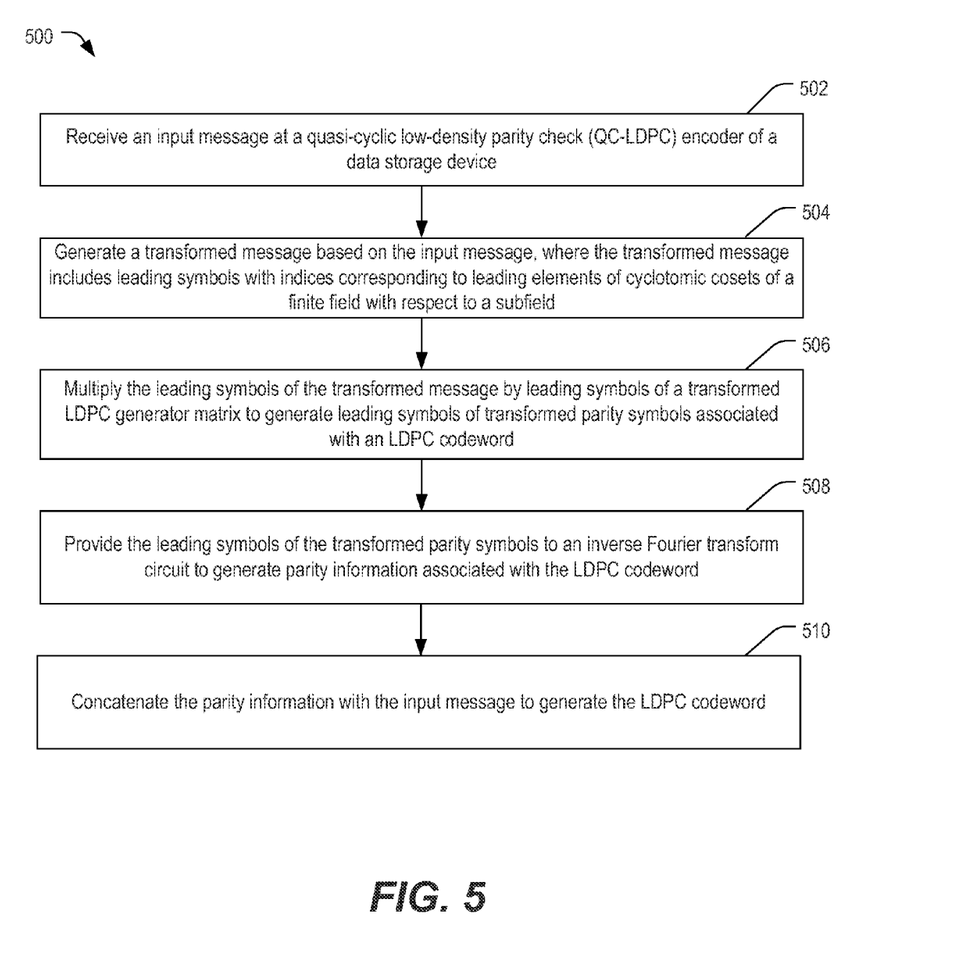
FIG. 5 is a flow chart of a particular illustrative embodiment of a method of encoding data that may be performed at the QC-LDPC encoder of FIG. 1.

Referring to FIG. 5, a particular embodiment of a method 500 is depicted. The method 500 may be performed in a data storage device, such as the data storage device 102 of FIG. 1. For example, the method 500 may be performed by the QC-LDPC encoder 124 of FIG. 1.

The method 500 may include receiving an input message at a QC-LDPC encoder of a data storage device, at 502. To illustrate, the input message may correspond to the input message 138 or the input message m of FIG. 2. The QC-LDPC encoder may correspond to the QC-LDPC encoder 124, and the data storage device may correspond to the data storage device 102, as illustrative examples.

The method 500 may further include generating a transformed message based on the input message, at 504. For example, the transformed message may correspond to the transformed message 142 or the transformed message $m^F$ of FIG. 2. The transformed message includes leading symbols with indices corresponding to leading elements of cyclotomic cosets of a finite field with respect to a subfield.

The method 500 may further include multiplying the leading symbols of the transformed message by leading symbols of a transformed LDPC generator matrix to generate leading symbols of transformed parity symbols associated with an LDPC codeword, at 506. To illustrate, the transformed LDPC generator matrix may correspond to the transformed LDPC generator matrix $G^F$ of FIG. 2. The LDPC codeword may correspond to the LDPC codeword 160 of FIG. 1 or the LDPC codeword c of FIG. 2. The leading symbols of the transformed parity symbols may correspond to the transformed parities 146 of FIG. 1 or the transformed leading parity symbols of $m^F G^F$ described with reference to FIG. 2, as illustrative examples.

The transformed message may further include non-leading transformed message symbols. In a particular embodiment, the matrix multiplier circuit does not multiply the non-leading symbols of the transformed message with any symbols of the transformed LDPC generator matrix. For example, using the partial-parallel architecture 300 of FIG. 3, non-leading symbols of the transformed message $m^F$ may be omitted (e.g., not selected for operations) during multiplication performed by the generator matrix multiplication circuit 144 of FIG. 1.

The method 500 may further include providing the leading symbols of the transformed parity symbols to an inverse Fourier transform circuit to generate parity information, at 508. The inverse Fourier transform circuit may correspond to the inverse Fourier transform circuit 148 of FIG. 1. The parity information may correspond to the parity information 150 of FIG. 1 or the parity information p of FIG. 2.

In an illustrative implementation, the inverse Fourier transform circuit is responsive to both the transformed leading parity symbols and transformed non-leading parity symbols. In other examples, only the transformed leading parity symbols are input to the inverse Fourier transform stage, and the inverse Fourier transform stage is configured to implement an efficient architecture for inverse Fourier transform using the transformed leading parity symbols. In any of the foregoing illustrative examples, the parity information generated by the inverse Fourier transform would be the same.

The method 500 may further include combining the parity information with a systematic portion to generate the LDPC codeword, such as by concatenating the parity information with the systematic portion to generate the LDPC codeword, at 510. The systematic portion may correspond to the input message. For example, the systematic portion may correspond to the input message 138 and/or the systematic portion s of FIG. 2. The parity information may be combined with the systematic portion by the circuitry 152 of FIG. 1.

In a particular embodiment, the transformed message is generated by a Fourier transform circuit, such as the Fourier transform circuit 140. The transformed leading parity symbols may be generated by a matrix multiplier circuit, such as the generator matrix multiplication circuit 144. The Fourier transform circuit may receive all blocks of symbols of the input message, and the inverse Fourier transform circuit may receive only parity symbols (e.g., only leading parity symbols, or both leading and non-leading parity symbols). The Fourier transform circuit may be configured to receive k blocks of symbols of the input message, and the inverse Fourier transform circuit may be configured to receive n–k blocks of symbols of the transformed leading parity symbols, where k indicates a positive integer number and n indicates a positive integer number that is greater than k.

Techniques described herein may be applicable to binary or non-binary LDPC techniques. For example, the method 500 of FIG. 5 is not limited to binary codewords. In some implementations, the LDPC codeword is formed of binary symbols. In other implementations, the LDPC codeword may be formed of non-binary symbols.

Although various components depicted herein are illustrated as block components and described in general terms, such components may include one or more microprocessors, state machines, or other circuits configured to enable the QC-LDPC encoder 124 of FIG. 1 to perform encoding to generate a codeword. For example, the QC-LDPC encoder 124 may represent physical components, such as hardware controllers, state machines, logic circuits, or other structures, to enable the QC-LDPC encoder 124 to perform a Fourier transform operation, matrix multiplication, and an inverse Fourier transform operation as described with reference to FIG. 1.

The QC-LDPC encoder 124 may be implemented using a microprocessor or microcontroller programmed to receive an input message, to provide the input message to Fourier transform stage (e.g., as described with respect to the Fourier transform circuit 140), to route the transformed message to a matrix multiplication stage to generate a transformed parity portion of a codeword (e.g., as described with respect to generator matrix multiplication circuit 144), and to provide the transformed parity portion to an inverse Fourier transform stage (e.g., as described with respect to the inverse Fourier transform circuit 148).

In a particular embodiment, the QC-LDPC encoder 124 includes a processor executing instructions that are stored at the memory 104. Alternatively, or in addition, instructions that are executed by the processor may be stored at a separate memory location that is not part of the memory 104, such as at a read-only memory (ROM) that may be included in the controller 120.

In a particular embodiment, the data storage device 102 may be implemented in a portable device configured to be selectively coupled to one or more external devices. However, in other embodiments, the data storage device 102 may be attached to or embedded within one or more host devices, such as within a housing of a host communication device. For example, the data storage device 102 may be within a packaged apparatus such as a wireless telephone, a tablet computer, a laptop computer, a personal digital assistant (PDA), a gaming device or console, a portable navigation device, or other device that uses internal non-volatile memory. In a particular embodiment, the data storage device 102 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory; and
a quasi-cyclic low-density parity-check (QC-LDPC) encoder configured to encode data for storage into the non-volatile memory, the QC-LDPC encoder including:
 a Fourier transform circuit configured to receive an input message and to generate a transformed message based on the input message, wherein the transformed message includes leading symbols with indices corresponding to leading elements of cyclotomic cosets of a finite field with respect to a subfield; and
 a matrix multiplier circuit configured to multiply the leading symbols of the transformed message by leading symbols of a transformed LDPC generator matrix to generate leading symbols of transformed parity symbols associated with an LDPC codeword,
wherein the QC-LDPC encoder is configured to provide the leading symbols of the transformed parity symbols to an inverse Fourier transform circuit to generate parity information of the LDPC codeword.

2. The data storage device of claim 1, wherein the transformed message further includes non-leading symbols, and wherein the matrix multiplier circuit does not multiply the non-leading symbols of the transformed message with any symbols of the transformed LDPC generator matrix.

3. The data storage device of claim 1, further comprising circuitry configured to combine the parity information with the input message to generate the LDPC codeword.

4. The data storage device of claim 3, wherein the Fourier transform circuit and the circuitry are each configured to receive the input message.

5. The data storage device of claim 3, wherein the circuitry includes selection logic configured to concatenate the input message and the parity information to generate the LDPC codeword.

6. The data storage device of claim 1, wherein the Fourier transform circuit is configured to receive all blocks of symbols of the input message, and wherein the inverse Fourier transform circuit is configured to receive only parity symbols.

7. The data storage device of claim 1, wherein the LDPC codeword is formed of binary symbols.

8. The data storage device of claim 1, wherein the LDPC codeword is formed of non-binary symbols.

9. The data storage device of claim 1, further comprising a controller that is operationally coupled to the non-volatile memory, wherein the controller includes the QC-LDPC encoder.

10. The data storage device of claim 1, wherein the non-volatile memory has a three-dimensional (3D) configuration that is monolithically formed in one or more physical levels of arrays of memory cells having an active area above a silicon substrate, and further comprising circuitry associated with operation of the memory cells.

11. A method comprising:
at a quasi-cyclic low-density parity-check (QC-LDPC) encoder of a data storage device, performing:
 receiving an input message;
 generating a transformed message based on the input message, wherein the transformed message includes leading symbols with indices corresponding to leading elements of cyclotomic cosets of a finite field with respect to a subfield;
 multiplying the leading symbols of the transformed message by leading symbols of a transformed LDPC generator matrix to generate leading symbols of transformed parity symbols associated with an LDPC codeword; and
 providing the leading symbols of the transformed parity symbols to an inverse Fourier transform circuit to generate parity information of the LDPC codeword.

12. The method of claim 11, further comprising combining the parity information with the input message to generate the LDPC codeword.

13. The method of claim 12, wherein the parity information is concatenated with the input message to generate the LDPC codeword.

14. The method of claim 11, wherein the transformed message is generated by a Fourier transform circuit, and wherein the leading symbols of the transformed parity symbols are generated by a matrix multiplier circuit.

15. The method of claim 14, wherein the transformed message further includes non-leading symbols, and wherein the matrix multiplier circuit does not multiply the non-leading symbols of the transformed message with any symbols of the transformed LDPC generator matrix.

16. The method of claim 14, wherein the Fourier transform circuit receives all blocks of symbols of the input message, and wherein the inverse Fourier transform circuit receives only parity symbols.

17. The method of claim 11, wherein the LDPC codeword is formed of binary symbols.

18. The method of claim 11, wherein the LDPC codeword is formed of non-binary symbols.

19. The method of claim 11, wherein the data storage device further includes a controller and a non-volatile memory that is operationally coupled to the controller, and wherein the controller includes the QC-LDPC encoder.

20. The method of claim 19, wherein the non-volatile memory has a three-dimensional (3D) configuration that is monolithically formed in one or more physical levels of arrays of memory cells having an active area above a silicon substrate, and wherein the non-volatile memory further includes circuitry associated with operation of the memory cells.

* * * * *